US011596083B2

(12) United States Patent
Helberg et al.

(10) Patent No.: US 11,596,083 B2
(45) Date of Patent: Feb. 28, 2023

(54) LIQUID COOLING MODULE FOR AN INFORMATION HANDLING SYSTEM

(71) Applicant: Dell Products L.P., Round Rock, TX (US)

(72) Inventors: Christopher Michael Helberg, Austin, TX (US); Steven Michael Christensen, Austin, TX (US); Timothy Ray Graham, Round Rock, TX (US); Eric N. Sendelbach, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/025,767

(22) Filed: Sep. 18, 2020

(65) Prior Publication Data

US 2022/0095482 A1 Mar. 24, 2022

(51) Int. Cl.
*H05K 7/20* (2006.01)
*G06F 1/20* (2006.01)

(52) U.S. Cl.
CPC ......... *H05K 7/20272* (2013.01); *G06F 1/206* (2013.01); *H05K 7/20163* (2013.01); *H05K 7/20209* (2013.01)

(58) Field of Classification Search
CPC .......... H05K 7/20272; H05K 7/20163; H05K 7/20209; G06F 1/206
USPC ....................................................... 361/699
See application file for complete search history.

(56) References Cited

U.S. PATENT DOCUMENTS

| 9,215,832 | B2 * | 12/2015 | Chang | H05K 7/20781 |
| 9,516,791 | B2 * | 12/2016 | Chester | F25D 23/12 |
| 2004/0008483 | A1 * | 1/2004 | Cheon | G06F 1/20 361/679.53 |
| 2005/0024831 | A1 * | 2/2005 | Phillips | F28D 15/043 361/700 |
| 2006/0187638 | A1 * | 8/2006 | Vinson | H05K 7/20009 361/698 |
| 2007/0109739 | A1 * | 5/2007 | Stefanoski | G06F 1/187 361/679.47 |
| 2007/0125522 | A1 * | 6/2007 | Stefanoski | F28D 1/024 165/104.21 |
| 2011/0279969 | A1 * | 11/2011 | Memon | H01L 23/427 361/679.47 |

(Continued)

FOREIGN PATENT DOCUMENTS

CN 206895085 U * 1/2018 ............... H05K 7/20
FR 3030999 A1 * 6/2016 ......... H05K 7/20145

*Primary Examiner* — Anatoly Vortman
(74) *Attorney, Agent, or Firm* — McDermott Will & Emery LLP

(57) ABSTRACT

Systems and methods are disclosed for a liquid cooling module for an information handling system that may include a mounting card configured to mount the liquid cooling module to a card slot proximate to a graphics card; a radiator inlet configured to receive a heated liquid from a pump of the graphics card; a radiator inlet tube configured to transfer the heated liquid from the graphics card to the liquid cooling module; a radiator configured to receive the heated liquid via a radiator inlet; a blower configured to direct a surrounding air flow across the radiator to cool the heated liquid; a radiator outlet configured to receive the cooled liquid from the radiator; and a radiator outlet tube configured to transfer the cooled liquid from the liquid cooling module to the graphics card.

20 Claims, 5 Drawing Sheets

(56) References Cited

U.S. PATENT DOCUMENTS

2016/0381838 A1* 12/2016 Nakanishi ............... F28D 15/06
                                                            361/679.53
2017/0181322 A1*  6/2017 Shelnutt ............. H05K 7/20627
2018/0279510 A1*  9/2018 Johnson ............. H05K 7/20772
2019/0324506 A1* 10/2019 Shabbir ............. H05K 7/20154

* cited by examiner

400

```
┌─────────────────────────────────────────────────────────────┐
│ MOUNTING, BY A MOUNTING CARD, THE LIQUID COOLING MODULE TO A│
│         CARD SLOT PROXIMATE TO THE GRAPHICS CARD.           │
│                            410                              │
└─────────────────────────────────────────────────────────────┘
                              ↓
┌─────────────────────────────────────────────────────────────┐
│ TRANSFERRING, BY A RADIATOR INLET TUBE, A HEATED LIQUID FROM│
│       THE GRAPHICS CARD TO THE LIQUID COOLING MODULE.       │
│                            420                              │
└─────────────────────────────────────────────────────────────┘
                              ↓
┌─────────────────────────────────────────────────────────────┐
│  RECEIVING, BY A RADIATOR INLET, THE HEATED LIQUID FROM THE │
│                    PUMP OF THE GRAPHICS CARD.               │
│                            430                              │
└─────────────────────────────────────────────────────────────┘
                              ↓
┌─────────────────────────────────────────────────────────────┐
│   RECEIVING, BY A RADIATOR, THE HEATED LIQUID VIA THE       │
│                        RADIATOR INLET.                      │
│                            440                              │
└─────────────────────────────────────────────────────────────┘
                              ↓
┌─────────────────────────────────────────────────────────────┐
│  DIRECTING, BY A BLOWER, A SURROUNDING AIR FLOW ACROSS THE  │
│                           RADIATOR.                         │
│                            450                              │
└─────────────────────────────────────────────────────────────┘
                              ↓
┌─────────────────────────────────────────────────────────────┐
│  RECEIVING, BY A RADIATOR OUTLET, THE COOLED LIQUID FROM THE│
│                           RADIATOR.                         │
│                            460                              │
└─────────────────────────────────────────────────────────────┘
                              ↓
┌─────────────────────────────────────────────────────────────┐
│TRANSFERRING, BY A RADIATOR OUTLET TUBE, THE COOLED LIQUID   │
│   FROM THE LIQUID COOLING MODULE TO THE GRAPHICS CARD.      │
│                            470                              │
└─────────────────────────────────────────────────────────────┘
```

FIG. 4

LIQUID COOLING MODULE FOR AN INFORMATION HANDLING SYSTEM

BACKGROUND

Field of the Disclosure

The disclosure relates generally to information handling systems, and in particular to a liquid cooling module for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed liquid cooling module configured to decrease an operating temperature of a graphics card of an information handling system includes: a mounting card configured to mount the liquid cooling module to a card slot proximate to the graphics card, the mounting card coupled to an exterior surface of the liquid cooling module; a radiator inlet configured to receive a heated liquid from a pump of the graphics card; a radiator inlet tube configured to transfer the heated liquid from the graphics card to the liquid cooling module, the radiator inlet tube coupling the radiator inlet to the pump; a radiator configured to receive the heated liquid via the radiator inlet; a blower configured to direct a surrounding air flow across the radiator, the surrounding air flow causing the heated liquid to become a cooled liquid; a radiator outlet configured to receive the cooled liquid from the radiator; and a radiator outlet tube configured to transfer the cooled liquid from the liquid cooling module to the graphics card, the radiator outlet tube coupling the radiator outlet to the pump.

In one or more of the disclosed embodiments, the card slot is a Peripheral Component Interconnect Express (PCIe) card slot.

In one or more of the disclosed embodiments, the pump is coupled to a graphics processing unit (GPU) of the graphics card via a plate, the plate configured to transfer heat from the GPU to the pump, the heat generated by the GPU.

In one or more of the disclosed embodiments, a rotational speed of the blower is controlled by a controller of the graphics card, the rotational speed controlling the surrounding air flow across the radiator.

In one or more of the disclosed embodiments, the liquid cooling module has a width encompassing one card slot.

In one or more of the disclosed embodiments, the liquid cooling module has a width encompassing two card slots.

In one or more of the disclosed embodiments, the liquid cooling module has a width encompassing three card slots.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 4 is a flowchart depicting selected elements of an embodiment of a method for decreasing an operating temperature of a graphics card of an information handling system.

DESCRIPTION OF PARTICULAR EMBODIMENT(S)

Figure 1:
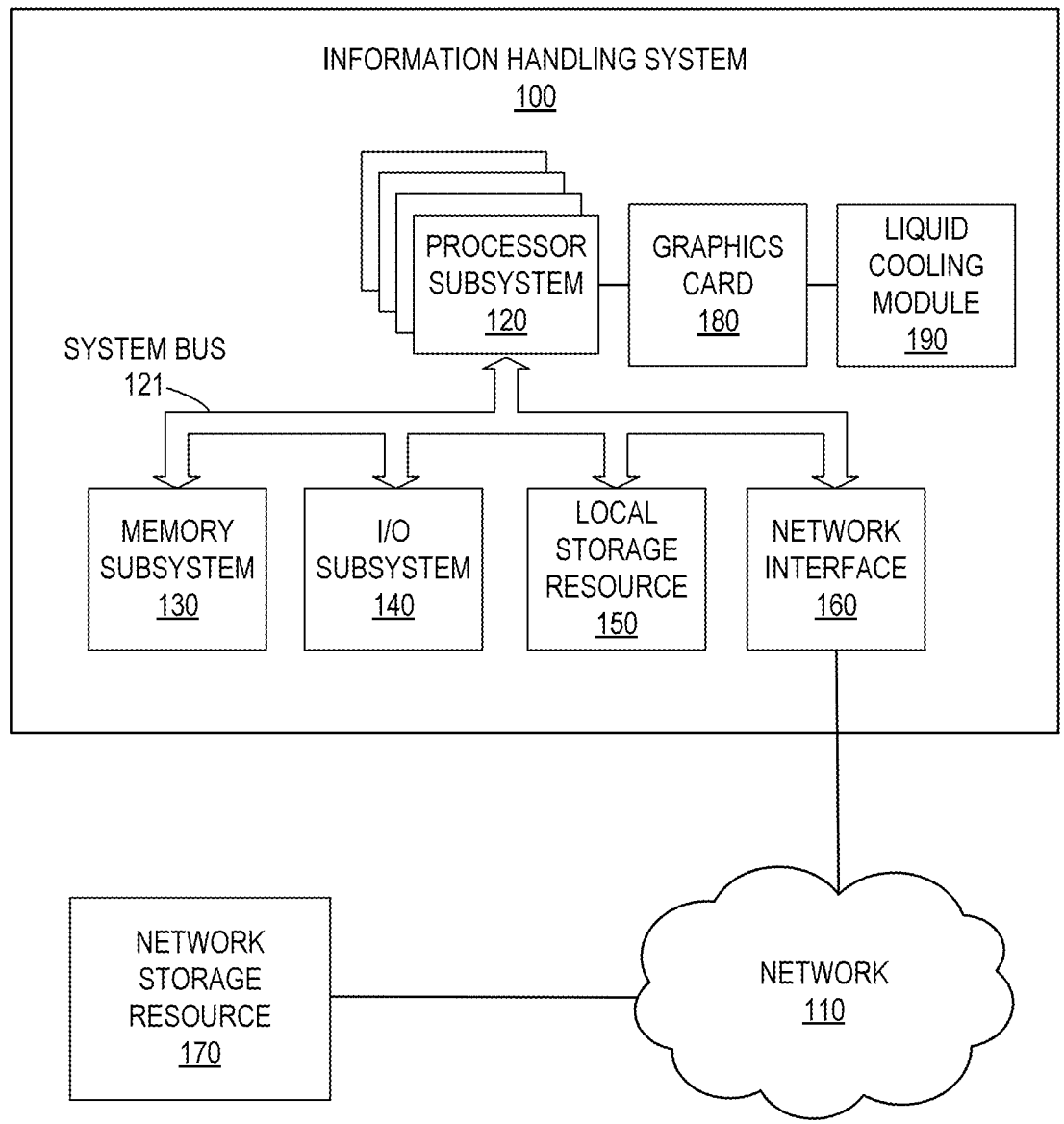
FIG. 1 is a block diagram of selected elements of an embodiment of an information handling system that includes a graphics card.

This document describes a liquid cooling module configured to decrease an operating temperature of a graphics card of an information handling system that includes a mounting card configured to mount the liquid cooling module to a card slot proximate to the graphics card, the mounting card coupled to an exterior surface of the liquid cooling module; a radiator inlet configured to receive a heated liquid from a pump of the graphics card; a radiator inlet tube configured to transfer the heated liquid from the graphics card to the liquid cooling module, the radiator inlet tube coupling the radiator inlet to the pump; a radiator configured to receive the heated liquid via the radiator inlet; a blower configured to direct a surrounding air flow across the radiator, the surrounding air flow causing the heated liquid to become a cooled liquid; a radiator outlet configured to receive the cooled liquid from the radiator; and a radiator outlet tube configured to transfer the cooled liquid from the liquid cooling module to the graphics card, the radiator outlet tube coupling the radiator outlet to the pump.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, a network interface 160, and a graphics card 180 coupled to a liquid cooling module 190. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

In one embodiment, graphics card 180 may comprise a system, device, or apparatus generally operable to support dedicated graphics for information handling system 100. Specifically, graphics card 180 may generate a feed of output images to be displayed to a user of information handling system (e.g., via I/O subsystem 140). In one embodiment, graphics card 180 may be or include a printed circuit board (PCB) configured to be inserted, or otherwise mounted, within a card slot (e.g., expansion slot) of information handling system 100. For example, graphics card 180 may be mounted to a Peripheral Component Interconnect Express (PCIe) motherboard interface of information handling system 100. In one embodiment, graphics card 180 may include a graphics processor unit (GPU), a random-access memory (RAM), and power regulators specifically designed for processing video images to offload processing demands on CPU (e.g., processor subsystem 120) and system RAM (e.g., memory subsystem 130). However, each of these dedicated components require power to operate, which may contribute to an overall power consumption of graphics card 180 (e.g., 75 W, 150 W, and the like). This overall power consumption may generate an increased operating temperature (e.g., greater than 90° C.) of graphics card 180 that can damage internal components unless adequately cooled while graphics card 180 is in use. Operating temperatures may be further increased in higher-end graphics cards (e.g., such as those designed for 3D rendering, gaming, virtual reality (VR), and the like). Thus, graphics cards typically require dedicated cooling systems to avoid damaging internal components. Graphics card 180 is discussed in further detail with respect to FIGS. 3A and 3B.

In one embodiment, liquid cooling module 190 may comprise a system, device, or apparatus generally operable to decrease an operating temperature of a graphics card, or other processing unit, of information handling system 100. In particular, liquid cooling module 190 may include one or more components designed to decrease the operating temperature of graphics card 180. In one embodiment, conventional graphics card cooling systems may include one or more on-board heatsink and fan assemblies designed to draw heat away from components and to blow the drawn heat away from the graphics card, respectively. However, on-board fan assemblies may generate loud acoustics (e.g., fan noise) while in use that can be distracting a user. In another embodiment, conventional graphics card cooling systems may comprise liquid cooling systems that include several components housed within the graphics card itself or within a dedicated housing. However, such dedicated housing typically requires a large hardware footprint occupying the motherboard (e.g., 120 mm$^2$ or larger) and may require non-standard mounting within an existing chassis architecture, thereby requiring additional space. In contrast, liquid cooling module 190 may reduce acoustics associated with conventional cooling systems while easily mounting within existing chassis architecture of information handling system 100. Specifically, liquid cooling module 190 may house a radiator and blower (not shown in figure) that serve to effectively cool heated liquid received from graphics card 180 while mounted within an existing card slot proximate to graphics card 180 within information handling system 100. For example, liquid cooling module 190 may be mounted within a PCIe slot proximate to graphics card 180 such that liquid cooling module 190 does not require additional space within the existing chassis architecture. Liquid cooling module 190 is discussed in further detail with respect to FIGS. 2-4.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
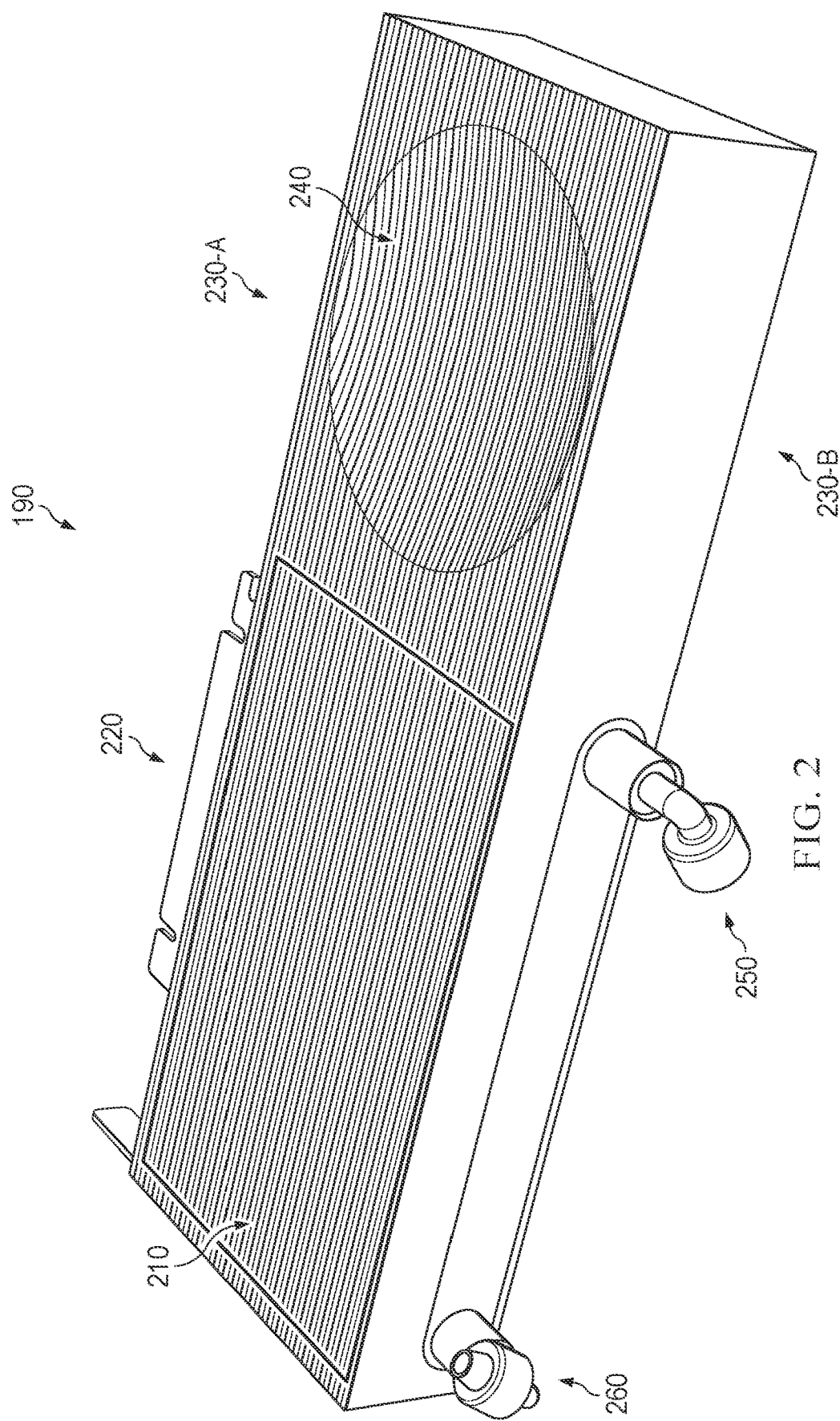
FIG. 2 is a front three-quarter view of an embodiment of a liquid cooling module of an information handling system.

FIG. 2 is a front three-quarter view of an embodiment of a liquid cooling module of an information handling system. As described above with respect to FIG. 1, liquid cooling module 190 may be generally operable to decrease an operating temperature of a graphics card, or other processing unit, of information handling system 100. Specifically, liquid cooling module 190 may include one or more components designed to decrease the operating temperature of graphics card 180. In the embodiment illustrated in FIG. 2, liquid cooling module 190 includes a radiator 210, a mounting card 220, blower inlets 230-A and 230-B (collectively referred to herein as "blower inlets 230"), a blower 240, a radiator inlet 250, and a radiator outlet 260. Liquid cooling module 190 may be removably coupled (e.g., via hardline, quick connect, and the like) to graphics card 180 via radiator inlet and radiator outlet tubes (not shown in figure). In other embodiments, liquid cooling module 190 may include additional, fewer, and/or any number of components suitable for decreasing an operating temperature of graphics card 180. It is noted that although decreasing the operating temperature of a graphics card (i.e., GPU) is described in the present disclosure, liquid cooling module 190 may additionally or alternatively be used in other embodiments to decrease an operating temperature of a central processing unit (CPU), vision processing unit (VPU), tensor processing unit (TPU), neural processing unit (NPU), physics processing unit (PPU), digital signal processor (DSP), image signal processor (ISP), field-programmable gate array (FPGA), and/or any other type of processing unit of an information handling system.

In one embodiment, mounting card 220 may be a suitable system, apparatus, or device operable to mount liquid cooling module 190. In particular, mounting card 220 may be or include a card, or a portion thereof, coupled to an exterior surface of liquid cooling module 190 and configured to fit within a card slot (e.g., disposed on a motherboard of information handling system 100). Mounting card 220 may be configured to mount, or otherwise removably couple, liquid cooling module 190 to a card slot proximate to graphics card 180. In one embodiment, mounting card 220 may be configured to mount liquid cooling module 190 to a PCIe card slot. For example, mounting card 220 may be configured to mount liquid cooling module 190 to a PCIe card slot proximate to graphics card 180 such that liquid cooling module 190 may be coupled to graphics card 180 without requiring additional space for a non-standard mounting within the existing chassis architecture. In other embodiments, mounting card 220 may be configured to mount liquid cooling module 190 to a Peripheral Component Interconnect (PCI) card slot, an Accelerated Graphics Port (AGP) card slot, an Industrial Standard Architecture (ISA) card slot, and/or any other card slots suitable for mounting liquid cooling module 190. In one embodiment, mounting card 220 may be comprised of a rigid plastic material. In another embodiment, mounting card 220 may be comprised of a reinforced metal alloy material. In one embodiment, mounting card 220 may be configured to fit within a x1 card slot. In other embodiments, mounting card 220 may be configured to fit within a x4 card slot, a x8 card slot, a x16 card slot, a x32 card slot, and/or any other physical configuration of card slot suitable for removably coupling with mounting card 220. It is noted that although a single mounting card 220 is shown FIG. 2, other embodiments of liquid cooling module 190 may include any number of mounting cards 220 suitable for mounting liquid cooling module 190.

In one embodiment, radiator inlet 250 may be a suitable system, apparatus, or device operable to receive a heated liquid from graphics card 180. Specifically, radiator inlet 250 may be configured to receive a heated liquid from a pump (not shown in figure) of graphics card 180 via a radiator inlet tube (not shown in figure). The radiator inlet tube may be configured to couple the radiator inlet 250 to the pump such that heated liquid may be transferred from the pump to the radiator inlet 250. In the embodiment shown in FIG. 2, radiator inlet 250 may provide an inlet for the heated liquid to enter radiator 210 to initiate a liquid cooling process.

In one embodiment, radiator 210 may be a suitable system, apparatus, or device operable to receive heated liquid via radiator inlet 250. In particular, radiator 210 may be or include a heat exchanger used to transfer thermal energy from the heated liquid to one or more fins (not shown in figure) disposed throughout radiator 210 as the heated liquid circulates through one or more turns in a tube (not shown in figure) inside radiator 210. In one embodiment, the one or more fins may be comprised of a material having a high thermal conductivity (e.g., aluminum, copper, and the like). The one or more fins may serve to effectively increase the surface area available for heat exchange to cool the heated liquid. In particular, the one or more fins may be coupled to the tube inside radiator 210, lodged between each row of the one or more turns in the tube, such that the one or more fins may draw heat away from the heated liquid circulating through the tube and release the heat into the ambient air. Surrounding air flow may be directed across the radiator 210 to carry the heat released by the one or more fins away from radiator 210.

In one embodiment, radiator 210 may reduce acoustics generated by graphics card 180 by increasing the surface area available for heat exchange. Specifically, radiator 210 may offload cooling processes conventionally performed by on-board heat sinks and fan assemblies within graphics card 180. For example, graphics card 180 may include one or more on-board heatsink and fan assemblies (not shown in figure) designed to draw heat away from components and blow the drawn heat away from graphics card 180, respectively. However, on-board fan assemblies may generate loud acoustics (e.g., fan noise) while in use that can be distracting a user. Further, these acoustics may be compounded during instances in which a user may require an increased performance of graphics card 180. For example, a user may increase a clock rate of GPU 320 (illustrated in FIGS. 3A and 3B) to cause GPU 320 to run at a higher speed than that which it was manufactured to run, thereby "overclocking" GPU 320 to increase performance. In response, on-board fan assemblies may be required to operate at a higher rotational speed to compensate for an increased voltage being consumed by the overclocked GPU 320, which may increase overall acoustics generated by graphics card 180. However, by increasing the surface area available for heat exchange as a heated liquid transfers heat away from graphics card 180 into liquid cooling module 190, radiator 210 may effectively offload a majority of the cooling process from the on-board fan assemblies such that the fan assemblies may operate at lower rotational speeds. In one embodiment, allowing on-board fan assemblies of graphics card 180 to operate at lower rotational speeds may decrease overall acoustics generated by graphics card 180 by 70%, thereby allowing increased performance while minimizing user distraction associated with loud acoustics.

In one embodiment, blower 240 may be a suitable system, apparatus, or device operable to direct a surrounding air flow across radiator 210 to cause the heated liquid to become a cooled liquid. That is, blower 240 may direct surrounding air flow across the one or more fins and turns of the tube inside radiator 210 to cause the heat released by the one or more fins to exit the housing of liquid cooling module 190. In the embodiment shown if FIG. 2, blower 240 includes blower inlets 230-A and 230-B located on opposite sides of liquid cooling module 190. Blower inlets 230 may be configured to draw a surrounding air flow into blower 240 at a perpendicular angle in relation to blower 240 such that blower 240 may direct the surrounding air flow across radiator 210. In other embodiments, blower 240 may include additional, or fewer, blower inlets 230 to draw surrounding air flow into blower 240. In one embodiment, blower 240 may be or include a centrifugal fan that includes a ducted housing to direct outgoing air across radiator 210. In other embodiments, blower 240 may be or include a positive displacement blower, a helical screw blower, a high-speed blower, a regenerative blower, and/or any other type of blower suitable for directing a surrounding air flow across radiator 210.

In one embodiment, radiator outlet 260 may be a suitable system, apparatus, or device operable to transfer a cooled liquid to graphics card 180. In particular, radiator outlet 260 may be configured to receive a cooled liquid from radiator 210, and to serve as an outlet to radiator 210 such that the cooled liquid may be transferred to graphics card 180 via a radiator outlet tube (not shown if figure). The radiator outlet tube may be configured to couple radiator outlet 260 to the pump of graphics card 180 such that the cooled liquid may be transferred from radiator outlet 260 to the pump. In the embodiment shown in FIG. 2, radiator outlet 260 may provide an outlet for the cooled liquid to exit radiator 210 to complete the liquid cooling process.

Figure 3A:
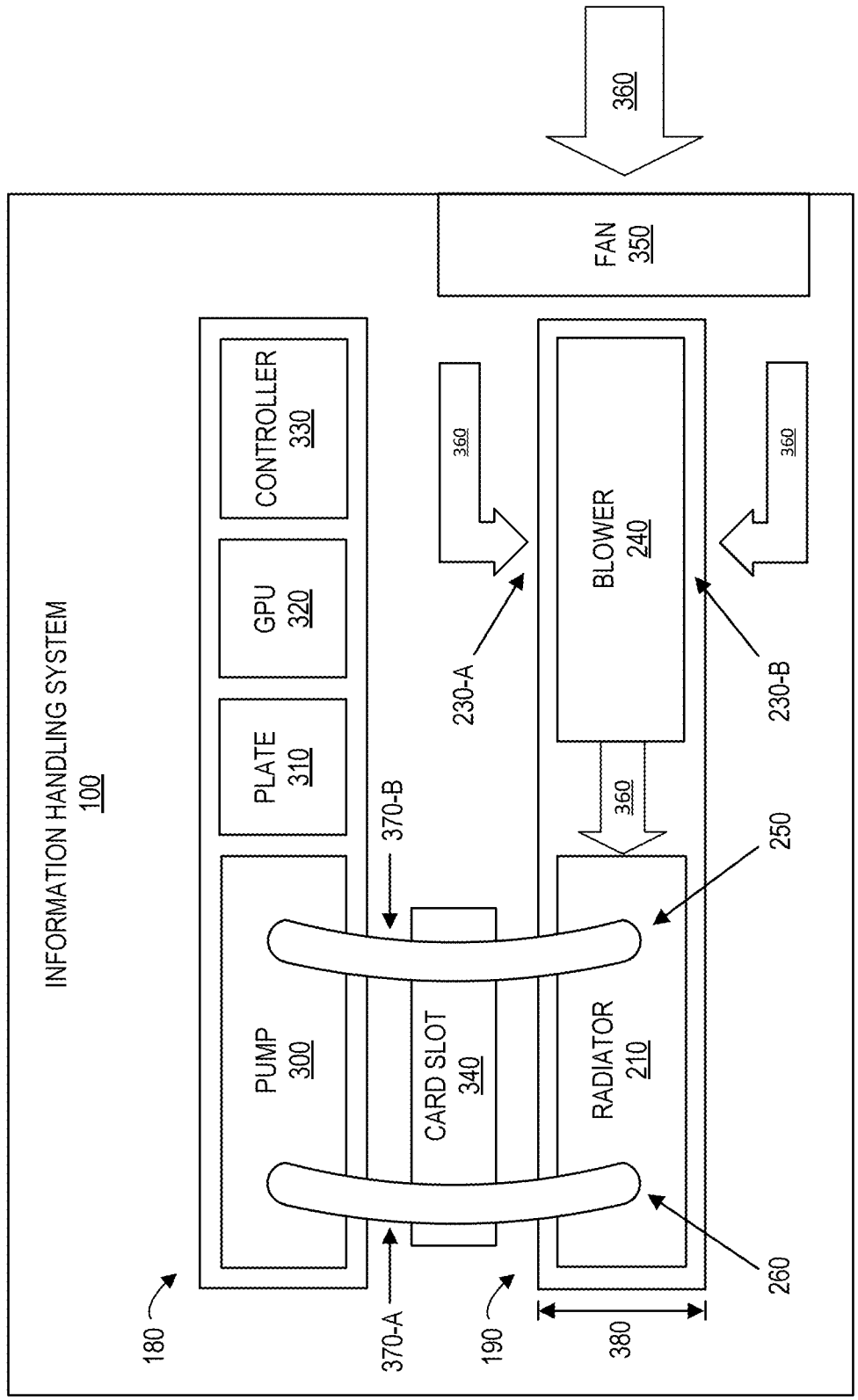
FIG. 3A is a block diagram of an embodiment of a graphics card and a liquid cooling module having a first width.

FIG. 3A is a block diagram of an embodiment of a graphics card and a liquid cooling module having a first width. Specifically, liquid cooling module 190 may have a width 380 encompassing two card slots (not shown in figure). This "double-wide" embodiment of liquid cooling module 190 may afford radiator 210 increased surface area with which to cool heated liquid circulating throughout liquid cooling module 190. Here, width 380 of liquid cooling module 190 allows adjacent card slot 340 to remain open and available for other uses (e.g., such as for mounting a graphics adapter card, network interface card, storage accelerator device, and the like). In this way, liquid cooling module 190 may be mounted without requiring additional space for a non-standard mounting within the existing chassis architecture. That is, liquid cooling module 190 may simply be mounted using an existing card slot of information handling system 100. As shown in FIG. 3A, liquid cooling module 190 may be mounted proximate to graphics card 180 such that liquid cooling module 190 may be coupled to graphics card 180 via radiator outlet tube 370-A and radiator inlet tube 370-B. In the embodiment illustrated in FIG. 3A, information handling system 100 includes graphics card 180, card slot 340, liquid cooling module 190, and fan 350. Graphics card 180 includes pump 300, plate 310, graphics processing unit (GPU) 320, and controller 330.

In the embodiment illustrated in FIG. 3A, heated liquid may be transferred to liquid cooling module 190 via radiator inlet tube 370-B such that the heated liquid may be cooled by radiator 210 as described above with respect to FIG. 2. Specifically, surrounding air flow 360 may be initially drawn into information handling system 100 via fan 350. In one embodiment, fan 350 may be or include an axial fan having one end directed outside of information handling system 100 (e.g., via a ventilation hole) and another end directed inside information handling system 100. The surrounding air flow 360 drawn into information handling system 100 may be further drawn into blower 240 by blower inlets 230. This is shown in FIG. 3A where the surrounding air flow 360 is drawn into blower 240 on opposite sides and at perpendicular angles in relation to blower 240. In turn, blower 240 may direct surrounding air flow 360 across radiator 210 causing the heated liquid to become a cooled liquid. The cooled liquid may be transferred back to pump 300 via radiator outlet tube 370-A such that the cooled liquid may be used to cool graphics card 180. Specifically, the cooled liquid may be used to cool GPU 320 of graphics card 180.

In one embodiment, pump 300 may be a suitable system, apparatus, or device operable to move liquid between graphics card 180 and liquid cooling module 190. In particular, pump 300 may move liquid (e.g., a coolant comprised of deionized water, corrosion inhibitor, and propylene glycol) from graphics card 180 to liquid cooling module 190, and vice versa, via radiator outlet tube 370-A and radiator inlet tube 370-B. In one embodiment, a flow rate of the liquid is regulated by pump 300. That is, pump 300 may regulate how quickly and/or slowly the liquid is transferred between graphics card 180 and liquid cooling module 190. Here, if the liquid is transferred too quickly, the liquid may not have adequate time to absorb heat (e.g., from GPU 320) before being transferred to liquid cooling module 190. Similarly, the liquid may not have adequate time to undergo the cooling process (e.g., within radiator 210) before being transferred to graphics card 180. In contrast, if the liquid is transferred too slowly, excess heat may build up around sensitive components within graphics card 180. In one embodiment, the flow rate of pump 300 may be controlled by pump 300. For example, pump 300 may include on-board circuitry (not shown in figure) configured to regulate flow rate for optimized cooling. In another embodiment, the flow rate of pump 300 may be controlled by controller 330. In the embodiment illustrated in FIG. 3A, pump 300 may be coupled to GPU 320 via plate 310 such that heat generated by GPU 320 may be transferred to liquid within pump 300, thereby causing the liquid to become heated prior to being transferred to liquid cooling module 190 for cooling.

In one embodiment, GPU 320 may be a suitable system, apparatus, or device operable to render images to be displayed to a user of information handling system 100. In particular, GPU 320 may perform complex mathematical and geometric calculations required for graphics rendering. Much of these calculations may be performed in parallel using multiple sets of data, thereby generating heat within the circuitry comprising GPU 320. For example, GPU 320 may have an operating temperature in excess of 95° C. under demands for increased performance. Thus, GPU 320 may be coupled to pump 300 (e.g., via plate 310) such that heat generated by GPU 320 may be transferred to liquid within pump 300 and transferred away from GPU 320 to liquid cooling module 190 to undergo a liquid cooling process. Once the heated liquid is cooled, the cooled liquid may return to pump 300 such that GPU 320 may transfer heat to the cooled liquid causing the cooled liquid to become heated. The heated liquid may then be transferred away from GPU 320 to liquid cooling module 190 to again undergo the liquid cooling process.

In one embodiment, plate 310 may be a suitable system, apparatus, or device operable to transfer heat generated by GPU 320 into liquid contained within pump 300. Specifically, plate 310 may be used to couple pump 300 to GPU 320 such that plate 310 may absorb and transfer heat generated by GPU 320 into liquid within pump 300. Plate 310 may be comprised of material having a high thermal conductivity (e.g., aluminum, copper, and the like) and may include one or more flow paths through which liquid may flow. For example, plate 310 may include one or more flow paths through which liquid may flow from pump 300 such that the liquid may effectively dissipate heat absorbed by plate 310 from a surface of GPU 320. It is noted that although transferring heat generated by GPU 320 is described in the present disclosure, plate 310 may additionally or alternatively be used in other embodiments to couple pump 300 to a central processing unit (CPU), vision processing unit (VPU), tensor processing unit (TPU), neural processing unit (NPU), physics processing unit (PPU), digital signal processor (DSP), image signal processor (ISP), field-programmable gate array (FPGA), and/or any other type of processing unit and/or memory of an information handling system.

In one embodiment, controller 330 may be a suitable system, apparatus, or device operable to control one or more components of graphics card 180 and liquid cooling module 190. In particular, controller 330 may be or include a printed circuit board (PCB) configured to control one or more components of graphics card 180 and liquid cooling module 190 for optimized cooling of graphics card 180. In one embodiment, controller 330 may control a flow rate of pump 300, thereby regulating how quickly and/or slowly liquid is transferred between graphics card 180 and liquid cooling module 190. In another embodiment, controller 330 may control a rotational speed of blower 240. Here, the rotational speed of blower 240 may control the surrounding air flow 360 across radiator 210. That is, the rotational speed of blower 240 may determine how quickly and/or slowly a heated liquid (transferred from graphics card 180) is cooled during the liquid cooling process. Conventional controllers of graphics cards may be configured to simply control rotational speed of on-board fan assemblies within the graphics cards. For example, a conventional controller may be used to increase rotational speed of an on-board fan assembly to compensate for an increased voltage being consumed by an overclocked GPU. In contrast, controller 330 may be additionally configured to regulate a rotational speed of blower 240. That is, controller 330 may control rotational speed of an on-board fan assembly of graphics card 180 in addition to rotational speed of blower 240 to ensure optimized cooling, increased performance, and decreased overall acoustics of graphics card 180.

Figure 3B:
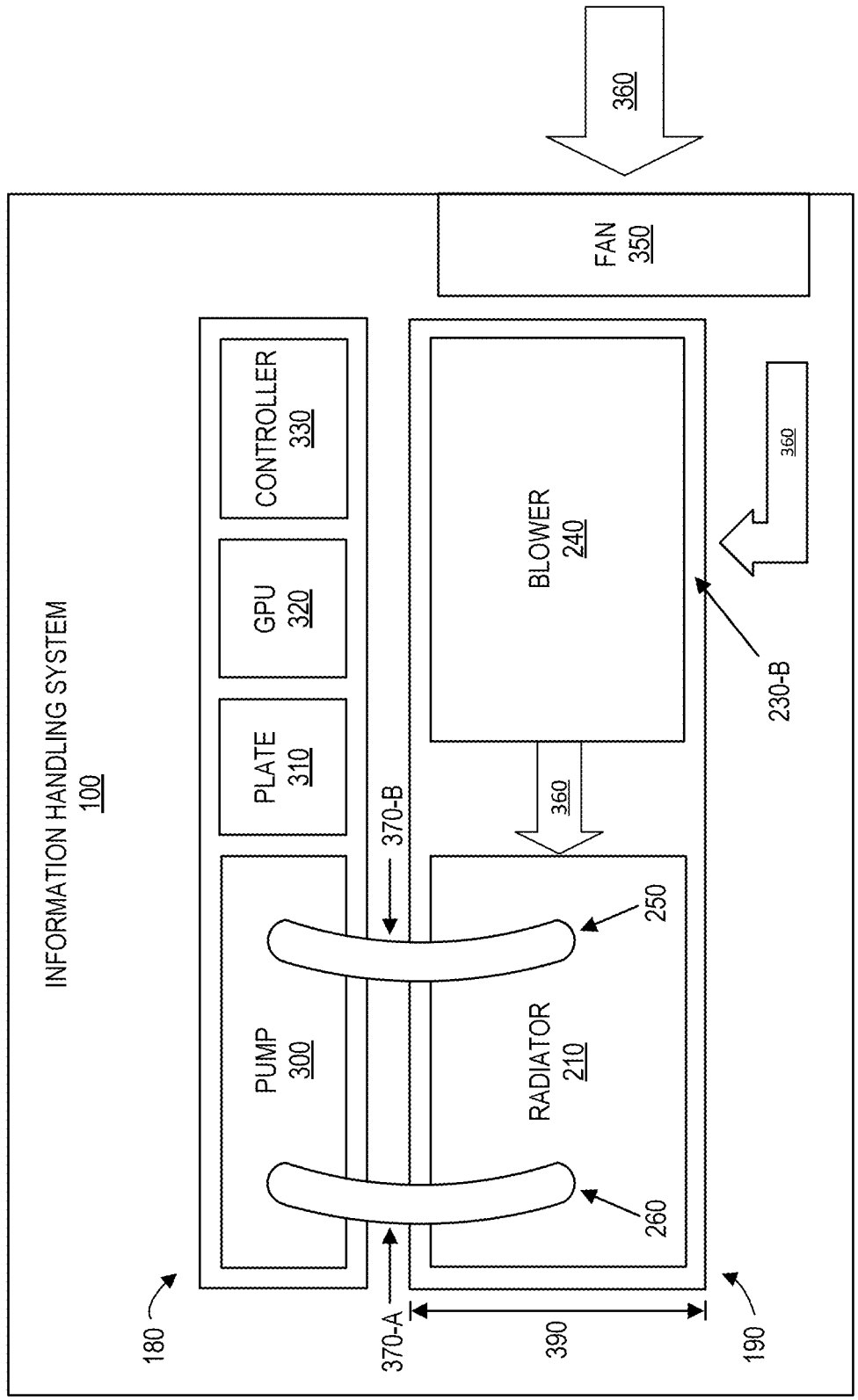
FIG. 3B is a block diagram of an embodiment of a graphics card and a liquid cooling module having a second width.

FIG. 3B is a block diagram of an embodiment of a graphics card and a liquid cooling module having a second width. Specifically, liquid cooling module 190 may have a width 390 encompassing three card slots (not shown in figure). Here, card slot 340 (illustrated in FIG. 3A) is no longer visible in FIG. 3B, indicating that width 390 of liquid cooling module 190 encompasses card slot 340 (in addition to two other adjacent card slots). This "triple-wide" embodiment of liquid cooling module 190 may afford radiator 210 an even greater surface area with which to cool heated liquid circulating throughout liquid cooling module 190 without requiring additional space for a non-standard mounting within the existing chassis architecture. That is, liquid cooling module 190 may simply be mounted using an existing card slot of information handling system 100. As shown in FIG. 3B, liquid cooling module 190 may be mounted proximate to graphics card 180 such that liquid cooling module 190 may be coupled to graphics card 180 via radiator outlet tube 370-A and radiator inlet tube 370-B. In the embodiment illustrated in FIG. 3B, graphics card 180 (including pump 300, plate 310, GPU 320, and controller 330), card slot 340, liquid cooling module 190 (including radiator 210, blower 240, radiator inlet 250, and radiator outlet 260), and fan 350 may be similar to those described above with respect to FIGS. 2 and 3A. It is noted that although a double-wide embodiment of liquid cooling module 190 is illustrated in FIG. 3A, and a triple-wide embodiment of liquid cooling module 190 is illustrated in FIG. 3B, other embodiments of liquid cooling module 190 may include widths of a single card slot, four card slots, five card slots, and/or any number of card slots suitable for mounting liquid cooling module 190.

FIG. 4 is a flowchart depicting selected elements of an embodiment of a method for decreasing an operating temperature of a graphics card of an information handling system. It is noted that certain operations described in method 400 may be optional or may be rearranged in different embodiments.

Method 400 may begin at step 410, where a mounting card of a liquid cooling module may mount the liquid cooling module to a card slot proximate to a graphics card. The mounting card may be coupled to an exterior surface of the liquid cooling module. For example, mounting card 220 may be coupled to an exterior surface of liquid cooling module 190 as shown in FIG. 2 such that mounting card 220 may mount liquid cooling module 190 to a card slot as shown in FIGS. 3A and 3B. In step 420, a radiator inlet tube of the liquid cooling module may transfer a heated liquid from the graphics card to the liquid cooling module. The radiator inlet tube may couple a radiator inlet of the liquid cooling module to a pump of the graphics card. For example, radiator inlet tube 370-B may couple radiator inlet 250 to pump 300 as shown in FIGS. 3A and 3B such that radiator inlet tube 370-B may transfer heated liquid from graphics card 180 to liquid cooling module 190. In step 430, the radiator inlet may receive the heated liquid from the pump of the graphics card. For example, radiator inlet 250 may receive heated liquid from pump 300 via radiator inlet tube 370-B as shown in FIGS. 3A and 3B. In step 440, a radiator of the liquid cooling module may receive the heated liquid via the radiator inlet. For example, radiator 210 may receive heated liquid from radiator inlet 250 as shown in FIGS. 3A and 3B. In step 450, a blower of the liquid cooling module may direct a surrounding air flow across the radiator. The surrounding air flow may cause the heated liquid to become a cooled liquid. For example, blower 240 may direct surrounding air flow 360 across radiator 210 as shown in FIGS. 3A and 3B. In step 460, a radiator outlet of the liquid cooling module may receive the cooled liquid from the radiator. For example, radiator outlet 260 may receive the cooled liquid from radiator 210 as shown in FIGS. 3A and 3B. In step 470, a radiator outlet tube may transfer the cooled liquid from the liquid cooling module to the graphics card. The radiator outlet tube may couple the radiator outlet to the pump of the graphics card. For example, radiator outlet tube 370-A may couple radiator outlet 260 to pump 300 as shown in FIGS. 3A and 3B such that radiator outlet tube 370-A may transfer cooled liquid from liquid cooling module 190 to graphics card 180.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A liquid cooling system configured to decrease an operating temperature of a processor on a graphics card installed in a first card slot of an information handling system, the liquid cooling system comprising:
 a plate mounted on the graphics card and coupled to the processor;
 a pump coupled to the processor via the plate, wherein heat generated by the processor is transferred from the processor to heat a liquid within the pump; and
 a liquid cooling module on a mounting card installed in a second card slot of the information handling system, the liquid cooling module comprising:
  a radiator fluidly coupled to the pump and configured to cool the heated liquid received from the pump, the radiator comprising:
   a radiator inlet tube configured to transfer the heated liquid from the pump to the radiator; and
   a radiator outlet tube configured to transfer a cooled liquid from the radiator to the pump; and
  a blower comprising at least one blower inlet configured to receive a portion of an air flow and direct the portion of the air flow across the radiator, the portion of the air flow causing the heated liquid to become a cooled liquid.

2. The liquid cooling module of claim 1, wherein the second card slot is a Peripheral Component Interconnect Express (PCIe) card slot.

3. The liquid cooling system of claim 1, wherein:
 the plate comprised of a material having a high thermal conductivity, wherein the plate is configured to transfer the heat from the processor to the pump.

4. The liquid cooling system of claim 1, wherein a rotational speed of the blower is controlled by a controller on the graphics card, the rotational speed controlling the portion of the air flow across the radiator.

5. The liquid cooling system of claim 1, wherein the liquid cooling module has a width encompassing one card slot, wherein a third card slot is located between the first card slot and the second card slot.

6. The liquid cooling system of claim 1, wherein the liquid cooling module has a width encompassing two card slots.

7. The liquid cooling system of claim 1, wherein the liquid cooling module has a width encompassing three card slots.

8. A method for decreasing an operating temperature of a processor on a graphics card installed in a first slot of an information handling system, the method comprising:
 coupling a plate to the processor;
 coupling a pump to the processor via the plate, wherein heat generated by the processor is transferred from the processor via the plate to heat a liquid within the pump;
 mounting a mounting card of a liquid cooling module to a second card slot of the information handling system, the mounting card coupled to an exterior surface of the liquid cooling module;
 pumping, by the pump on the graphics card, the heated liquid from the graphics card through a radiator inlet tube to a radiator of the liquid cooling module;
 receiving, by a blower of the liquid cooling module, a portion of a surrounding air flow;
 directing, by the blower, an air flow across the radiator, the portion of the air flow causing the heated liquid to become a cooled liquid, wherein the cooled liquid is transferred back to the pump.

9. The method of claim 8, wherein the second card slot is a Peripheral Component Interconnect Express (PCIe) card slot.

10. The method of claim 8,
 the plate comprised of a material having a high thermal conductivity on the graphics card to transfer the heat from the processor to the pump.

11. The method of claim 8, further comprising:
 controlling, by a controller of the graphics card, a rotational speed of the blower, the rotational speed controlling the portion of the air flow across the radiator.

12. The method of claim 8, wherein the liquid cooling module has a width encompassing one card slot, wherein a third card slot is located between the first card slot and the second card slot.

13. The method of claim 8, wherein the liquid cooling module has a width encompassing two card slots.

14. The method of claim 8, wherein the liquid cooling module has a width encompassing three card slots.

15. An information handling system, comprising:
 a graphics card in a first card slot, the graphics card comprising:
 a processor;
 a plate coupled to the processor; and
 a pump coupled to the processor via plate, wherein heat generated by the processor is transferred from the processor via the plate to a liquid within the pump to heat the liquid, wherein the pump is configured for pumping the heated liquid;
 a radiator inlet tube having a first end coupled to the pump;
 a liquid cooling module mounted on a mounting card in a second card slot, the liquid cooling module including:
  a radiator inlet coupled to a second end of the radiator inlet tube and configured to receive the heated liquid from the pump;
  a radiator configured to receive the heated liquid from the pump via the radiator inlet;
  a blower comprising a plurality of inlets configured to receive a portion of an airflow surrounding the blower and configured to direct the portion of the air flow across the radiator to cool the heated liquid to become a cooled liquid;
  a radiator outlet configured to receive the cooled liquid from the radiator; and
  a radiator outlet tube having a first end coupled to the radiator outlet and a second end coupled to the pump, the radiator outlet tube configured to transfer the cooled liquid from the liquid cooling module to the pump.

16. The information handling system of claim 15, wherein the second card slot is a Peripheral Component Interconnect Express (PCIe) card slot.

17. The information handling system of claim 15, wherein the plate comprised of a material having a high thermal conductivity to transfer the heat from the processor to the pump.

18. The information handling system of claim 15, wherein a rotational speed of the blower is controlled by a controller of the graphics card, the rotational speed controlling the portion of the air flow across the radiator.

19. The information handling system of claim 15, wherein the liquid cooling module has a width encompassing one card slot.

20. The information handling system of claim 15, wherein the liquid cooling module has a width encompassing two card slots.

\* \* \* \* \*